(12) United States Patent
Sugimoto et al.

(10) Patent No.: US 6,733,327 B2
(45) Date of Patent: May 11, 2004

(54) CONNECTOR FOR BUTTON BATTERY CONTAINED IN ELECTRONIC DEVICE

(75) Inventors: Keiichi Sugimoto, Kariya (JP); Mitsuru Nakagawa, Chiryu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/465,626

(22) Filed: Jun. 20, 2003

(65) Prior Publication Data

US 2004/0038585 A1 Feb. 26, 2004

(30) Foreign Application Priority Data

Aug. 23, 2002 (JP) .................................... 2002-243808

(51) Int. Cl.⁷ ............................................... H01R 3/00
(52) U.S. Cl. ................................................... 439/500
(58) Field of Search ................................ 439/500, 627; 429/98, 100, 163, 179

(56) References Cited

U.S. PATENT DOCUMENTS

| | | | | |
|---|---|---|---|---|
| 4,998,888 A | * | 3/1991 | Link et al. ........... | 439/73 |
| 5,586,907 A | * | 12/1996 | Frantz et al. ........ | 439/500 |
| 5,805,423 A | * | 9/1998 | Wever et al. ........ | 361/760 |
| 5,876,241 A | * | 3/1999 | Frantz ................. | 439/500 |
| 5,922,489 A | * | 7/1999 | Adachi ................. | 429/100 |
| 5,931,693 A | * | 8/1999 | Yamazaki ............ | 439/500 |
| 5,980,309 A | * | 11/1999 | Frantz et al. ........ | 439/500 |
| 6,142,823 A | * | 11/2000 | Ishibashi ............. | 439/500 |
| 6,220,892 B1 | * | 4/2001 | Bishop ................. | 439/500 |
| 6,527,584 B2 | * | 3/2003 | Ninomiya ............ | 439/500 |
| 6,603,670 B1 | * | 8/2003 | Chien .................. | 361/801 |

FOREIGN PATENT DOCUMENTS

| | | |
|---|---|---|
| JP | U-63-43352 | 3/1988 |
| JP | A-H11-135094 | 5/1999 |

* cited by examiner

Primary Examiner—Tulsidas Patel
(74) Attorney, Agent, or Firm—Posz & Bethards, PLC

(57) ABSTRACT

A button battery having a circular plus terminal formed around its outer periphery is electrically connected to a circuit board through a connector mounted on the circuit board. The connector includes a pair of resilient arms contacting the plus terminal, a main stay formed at a rear side of the arms and an auxiliary stay formed at a front side of the arms. Both stays for supporting the connector are fixed to a surface of the circuit board by soldering. Since the connector is supported at both sides thereof by two stays, the stays can be made in a small size that is enough to secure strength for fixing the connector to the circuit board by soldering.

8 Claims, 6 Drawing Sheets

CONNECTOR FOR BUTTON BATTERY CONTAINED IN ELECTRONIC DEVICE

CROSS-REFERENCE TO RELATED APPLICATION

This application is based upon and claims benefit of priority of Japanese Patent Application No. 2002-243808 filed on Aug. 23, 2002, the content of which is incorporated herein by reference.

BACKGROUND OF THE INVENTION

1. Field of the Invention

The present invention relates to a connector for electrically connecting a button battery to a circuit board contained in an electronic device, and further relates to an electronic device in which the connector is used.

2. Description of Related Art

An example of a conventional connector for electrically connecting a button battery to a circuit board contained in an electronic device is shown in FIGS. 8A and 8B. A connector 500 made of a conductive metallic plate is composed of a pair of resilient arms 51 and a stay 502 for supporting the resilient arms 51. The pair of resilient arms 51 contacts a plus terminal of a button battery, the plus terminal being circularly formed around an outer periphery of the button battery. The stay 502 is fixed to a surface of a circuit board 20 by soldering.

The stay 502 has to be made in such a size (including its length L3) that the connector 500 is firmly fixed to the circuit board by soldering, withstanding a force applied to the connector 500 by resiliently inserting the button battery into the pair of resilient arms 51. If the stay 502 is not sufficiently large, it may be peeled off from the circuit board and electrical connection of the button battery cannot be maintained. Further, if the stay size is small, the connector 500 cannot keep its horizontal posture on the circuit board when it is placed on the circuit board for soldering, because a weight balance between the resilient arms 51 and stay 502 becomes unequal, and thereby the connector 500 falls down toward the resilient arms 51. On the other hand, it is desirable to make the stay size as small as possible to save a soldering area on the circuit board.

SUMMARY OF THE INVENTION

The present invention has been made in view of the above-mentioned problem, and an object of the present invention is to provide an improved connector for connecting a button battery to a circuit board. More particularly, an object of the present invention is to provide a connector having a stay that is able to keep its weight balance and is able to save a soldering space on a circuit board.

An electronic device such as transmitter for wirelessly sending signals for operating a keyless entry system of an automobile contains a button battery therein. The button battery has a plus terminal circularly formed around its outer periphery and a minus terminal formed on one flat surface of the button battery. The button battery is electrically connected to a circuit board contained in the electronic device through a plus connector contacting the plus terminal and a minus connector contacting the minus terminal. Both connectors are mounted on a surface of the circuit board by soldering.

The plus connector includes a pair of resilient arms resiliently contacting the plus terminal of the button battery, a main stay connected to a rear side of the resilient arms (a side opposite to a side where the battery is positioned), and an auxiliary stay connected to a front side of the resilient arms (a side where the battery is positioned). The plus connector, as a whole, is integrally formed from a conductive metallic plate. Both stays support the plus connector on a surface of the circuit board, and at least the main stay is fixed to the surface by re-flow soldering. Alternatively, both stays may be fixed to the surface.

The plus connector is supported by both stays on the surface of the circuit board when the connector is placed on the surface for soldering. Therefore, the plus connector can keep its correct posture on the circuit board without enlarging the stay size only for keeping the posture of the connector. The stays can be made in such a size that is enough to secure a required bonding strength to the circuit board. Accordingly, a space for soldering the plus connector on the circuit board can be minimized. Preferably, the stays are formed in a rectangular or polygonal shape to avoid rotation of the plus connector relative to the circuit board in the re-flow soldering process.

The button battery may be held in a battery holder, made of an insulating resin material, supported on the circuit board. In this case, a terminal cover is integrally formed with the battery holder and is placed between the auxiliary stay and the minus terminal of the battery to secure insulation therebetween.

According to the present invention, the stays supporting the plus connector can be made small in size while ensuring that the plus connector keeps its correct posture in the process of soldering. Other objects and features of the present invention will become more readily apparent from a better understanding of the preferred embodiments described below with reference to the following drawings.

DETAILED DESCRIPTION OF THE PREFERRED EMBODIMENTS

Figure 1:
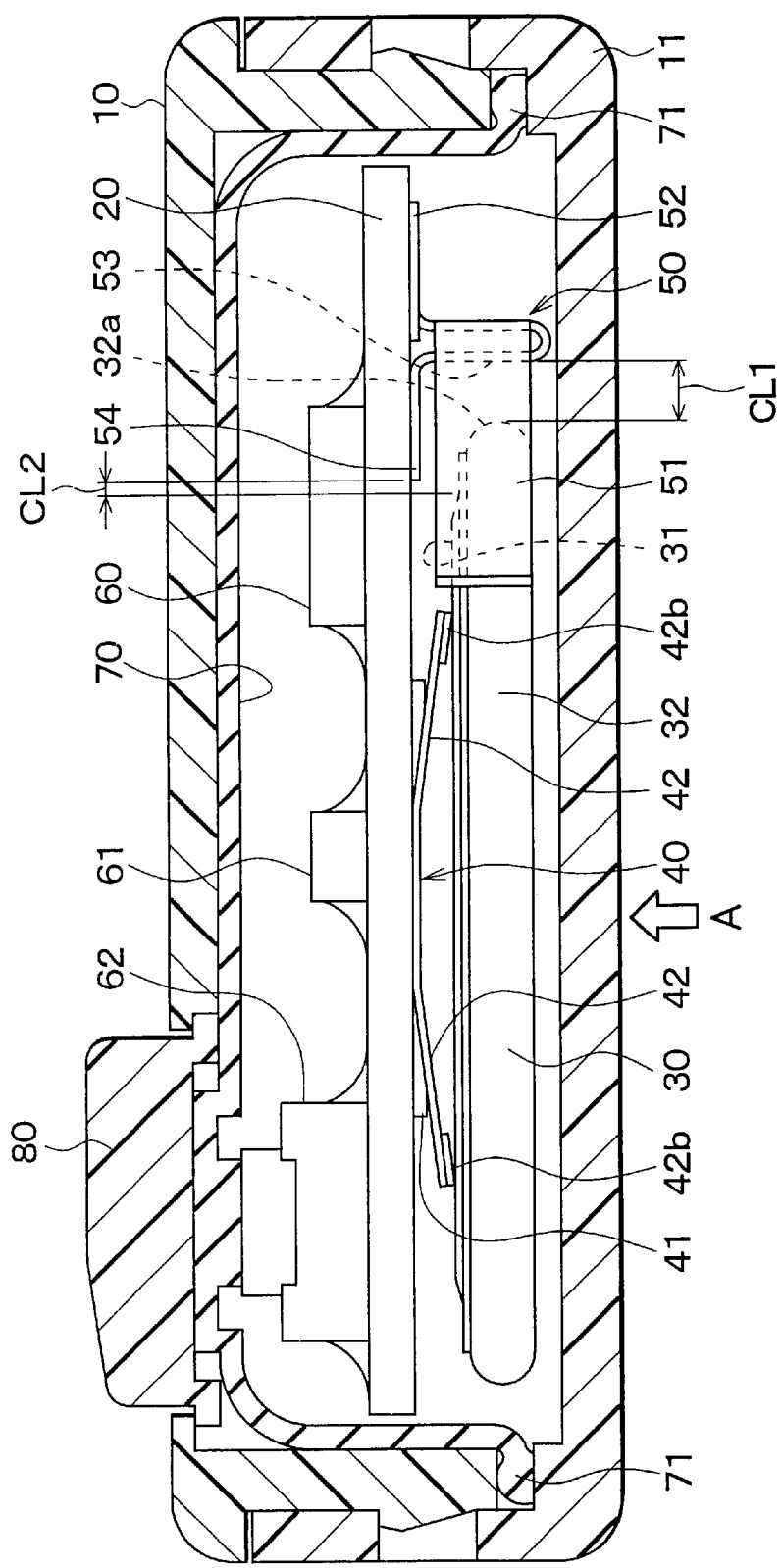
FIG. 1 is a cross-sectional view showing a transmitter for a keyless entry system for use in an automobile.

A first embodiment of the present invention will be described with reference to FIGS. 1–4B. FIG. 1 shows a transmitter for wirelessly sending signals for operating a keyless entry system of an automobile. A printed circuit board 20 on which various electronic components are mounted, a button battery 30, a connector 50 for connecting the button battery 30 to the circuit board 20, and other associated components are contained in a box-shaped casing composed of a pair of resin cases 10, 11. The size of the button battery 30 is about 20 mm in diameter.

On a front surface of the circuit board 20, an integrated circuit 60, a crystal oscillator 61, a tact switch 62 and other components are mounted. On a rear surface of the circuit board 20, a connector 50 for a plus terminal and another connector for a minus terminal are mounted. The connector 50 electrically contacts the plus terminal 32 of the button battery 30, which is circularly formed around an outer periphery 32a of the button battery 30. The other connector 40 electrically contacts the minus terminal 31 formed on a flat surface of the button battery 30.

The pair of resin cases 10 and 11 are connected to each other, and a peripheral lip 71 of a water-proof packing 70 is disposed between the pair of resin cases 10, 11 to prevent outside water from entering into the casing. A push-button 80 for operating the tact switch 62 is disposed outside of the water-proof packing 70. By pushing the push-button 80, electric power is supplied to the electronic components 60–62 from the button battery 30. The integrated circuit 60 controls the crystal oscillator 61 in response to pushing operation of the push-button 80, and thereby signals of the crystal oscillator 61 for operating the keyless entry system are wirelessly transmitted.

Figure 2:
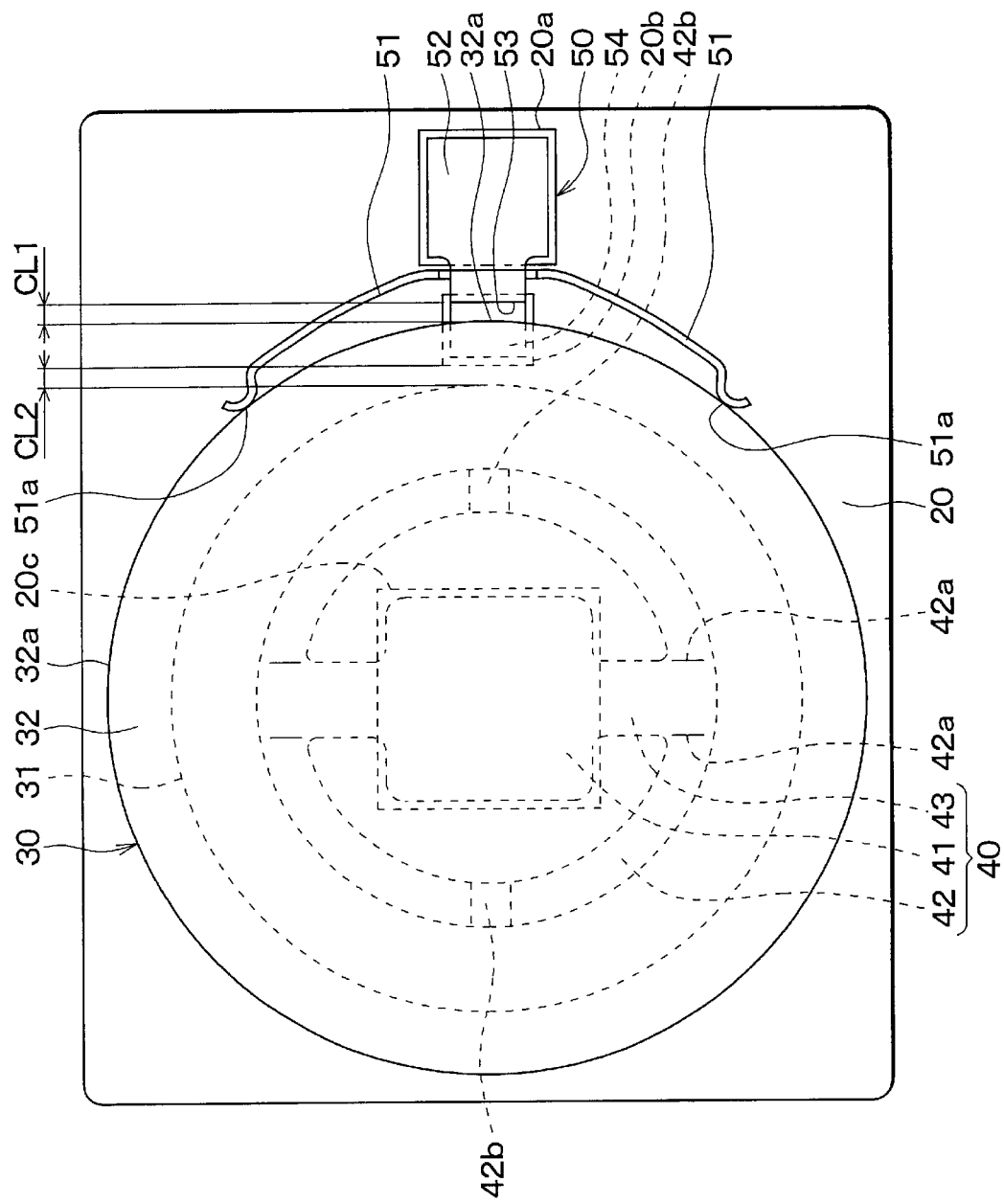
FIG. 2 is a plan view showing a connector for electrically connecting a button battery to a circuit board, viewed in direction A shown in FIG. 1, with a case removed.
Figure 3:
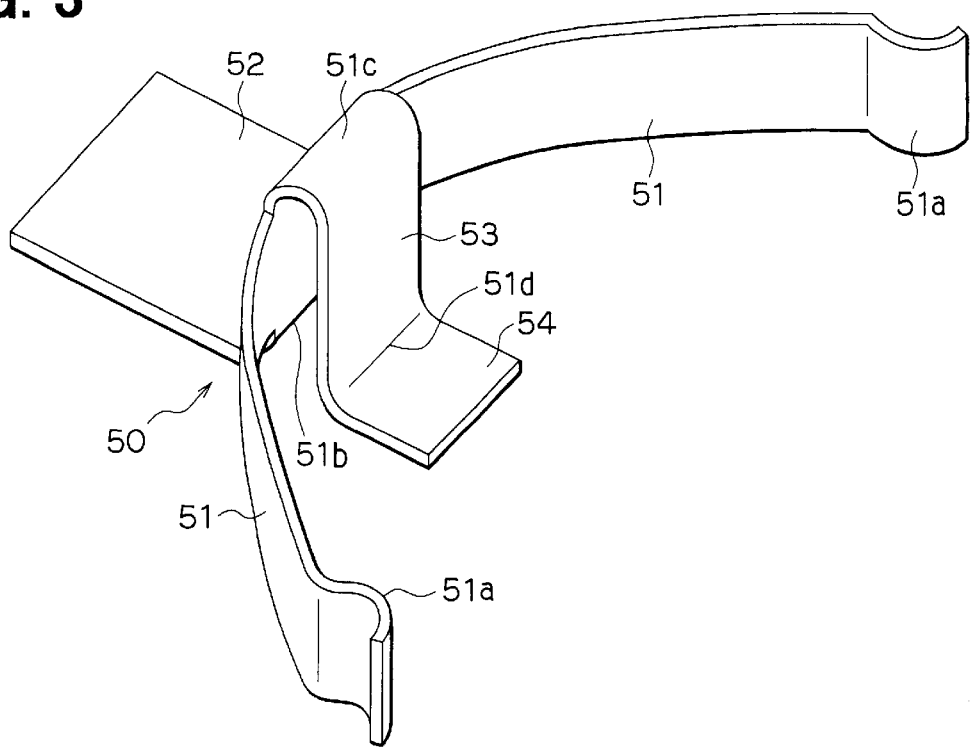
FIG. 3 is a perspective view showing the connector, as a first embodiment of the present invention.

Referring to FIG. 2, the structure of the connector 40 for the minus terminal will be described. The connector 40 is formed by stamping a conductive metallic plate and composed of a connector base 41, a circular spring member 42 and a pair of connecting members 43, all integrally formed. The circular spring member 42 is connected to the connector base 41 by the pair of connecting members 43. The connector base 41 formed in a rectangular shape is fixed to the rear surface of the circuit board 20 by soldering, as shown in FIG. 1. The circular spring member 42 is bent toward the button battery 30 along bending lines 42a so that the circular spring member 42 resiliently moves relative to the connector base 41. A pair of contacts 42b that contacts the minus terminal 31 of the button battery 30 is formed on the circular spring member 42 at positions shown in FIG. 2.

Now, referring FIGS. 2, 3, 4A and 4B, the structure of the connector 50 for the plus terminal will be described. The connector 50 is formed by stamping a conductive metallic plate. As the metallic plate, a copper alloy such as phosphor bronze or beryllium-copper that is plated with nickel and further plated with gold is used. Alternatively, a silver-plated stainless spring-plate or the like may be used. The metallic plate having a thickness of 0.1–0.3 mm is appropriate for the connector 50. In this particular embodiment, the metallic plate having a thickness of 0.2 mm is used. The connector 50 includes a pair of resilient arms 51, a main stay 52 bent from the resilient arms, and an auxiliary stay 54 connected to the resilient arms via a connecting portion 53. These portions of the connector 50 are all integrally formed.

The pair of resilient arms 51 are symmetrically formed with respect to the main and auxiliary stays 52, 54, and each arm 51 has a contact 51a formed at its tip. The contacts 51a are pushed against the plus terminal 32 circularly formed around the outer periphery 32a of the button battery 30 by a spring force of the resilient arms 51. Each contact 51a has an arch-shaped surface contacting the plus terminal 32. Each contact 51a has to be pushed against the plus terminal 32 to attain a required-minimum contact pressure, e.g., 50 grams, in order to make a good electrical contact. A spring constant of the resilient arm 51 is set to attain the required-minimum contact pressure.

The main stay 52 is positioned at a rear side of the resilient arms 51, i.e. at a side opposite to a battery side. The main stay 52 is connected to a land 20a formed on the circuit board 20 (shown in FIG. 2) by soldering. The auxiliary stay 54 is positioned at a front side, i.e., at a battery side, and connected to the resilient arms 51 via the connecting portion 53 having a portion 51c bent in a U-shape. The auxiliary stay 54 is connected to a land 20b formed on the circuit board 20 by soldering. It is advantageous to form at least either the main stay 52 or the auxiliary stay 54 in a rectangular shape to prevent rotation of the connector 50 relative to the circuit board 20 in the soldering process. In this particular embodiment, both stays 52, 54 are formed in a rectangular shape, as shown in the drawings.

The main stay 52 is bent from the resilient arms 51 at a bent portion 51b, forming a right angle (90°) relative to the resilient arms 51. The auxiliary stay 54 is bent from the connecting portion 53 at a bent portion 51d, forming a right angle relative to the connecting portion 53. The connecting portion 53 is connected to the resilient arms 51 via a U-shaped bent portion 51c and extends in parallel to the resilient arms 51.

Since both stays 52, 54 are fixed to the circuit board 20 by soldering, the connector 50 is firmly supported on the circuit board 20 when the button battery 30 is forcibly inserted into a space between the pair of resilient arms 51. The size of both stays 52, 54 is set to a smallest possible size which is able to secure a sufficient soldering strength in order to save the soldering space on the circuit board 20. Since the connector 50 is supported by both of the main stay 52 and the auxiliary stay 54, the size of both stays can be made small, compared with a single stay of the conventional connector. The connector 50 is automatically placed on the circuit board 20 in an assembling process. That is, a sucking nozzle of an automatic mounting machine sucks the main stay 52 of the connector 50. Therefore, the size of the main stay 52 is set to such a size that is enough to be sucked by the sucking nozzle.

If the connecting portion 53 contacts the outer periphery 32a of the button battery 30 when the button battery 30 is mounted on its position, the required-minimum contact pressure between the plus terminal 32 and the contact 51a may not be obtained. To avoid this situation, a clearance CL1 is provided between the outer periphery 32a and the connecting portion 53, as shown in FIGS. 1 and 2. The clearance CL1 is set to such a dimension that possible dimensional deviations of the connector 50 are absorbed. Thus, the contact between the outer periphery 32a and the connecting portion 53 is surely avoided.

On the other hand, if the button battery 30 is pushed abnormally hard, against a resilient force of the circular spring 42 of the connector 40 for the minus terminal, toward the circuit board 20 by a strong impact or vibration applied to the button battery 30, the outer periphery of the minus terminal 31 may contact the end portion of the auxiliary stay 54. If this occurs, the button battery is short-circuited. To avoid this situation, a certain clearance CL2 is provided between the outer periphery of the minus terminal 31 and the end portion of the auxiliary stay 54, as shown in FIGS. 1 and 2.

A process of manufacturing the connector 50 and a process of mounting the connector 50 on the circuit board 20 will be briefly explained. A cross-shaped plate for forming the connector 50 is stamped out from a metallic plate. Then, the main stay 52 and the auxiliary stay 54 are bent by press-work, and the resilient arms 51 including the contacts 51a are shaped into respective forms. Then, the connector 50 is heat-treated to eliminate stresses remaining therein and to give a predetermined spring constant to the resilient arms 51. Finally, the connector 50 is plated with gold. The connector 50 thus made is automatically picked up by a mounting machine by sucking the main stay 52 with a sucking nozzle of the machine. The main stay 52 and the auxiliary stay 54 are automatically placed on the lands 20a, 20b covered with solder paste, respectively. Then, the circuit board 20 on which the connector 50 is placed is put into an oven to connect the stays 52, 54 to the respective lands 20a, 20b by soldering under a re-flow process. Thus, the connector 50 is fixedly mounted on the circuit board 20.

As described above, the resilient arms 51 are supported by two stays, i.e., the main stay 52 formed at the rear side of the resilient arms 51 and the auxiliary stay 54 formed at the front side. Therefore, the connector 50 has a good weight balance between its front side and rear side without making the length of the main stay long as in the conventional stay 502. Accordingly, the connector 50 can be placed on the circuit board 20 in the soldering process, correctly keeping its horizontal posture. In other words, it is not necessary to enlarge the size of the stays 52, 54 for attaining the weight balance of the connector 50. Therefore, the space on the circuit board 20 for soldering the stays 52, 54 can be made small.

Figure 4A:
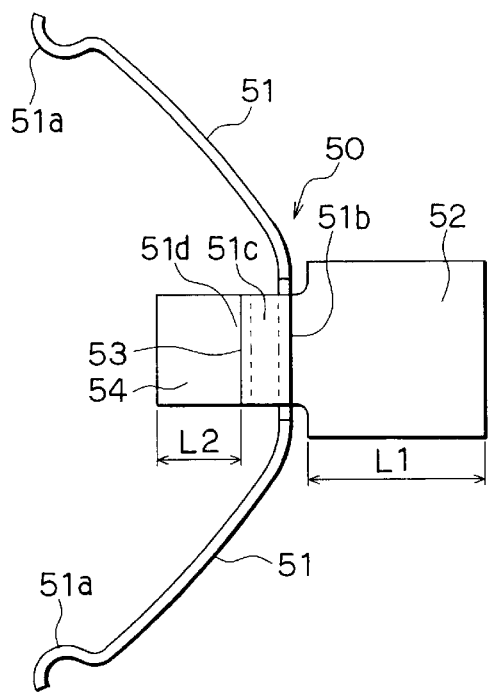
FIG. 4A is a plan view showing the connector.
Figure 4B:
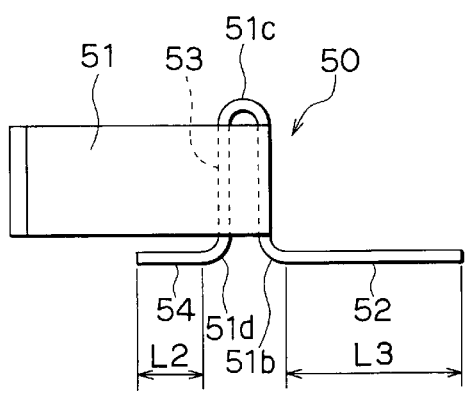
FIG. 4B is a side view showing the connector.
Figure 8A:
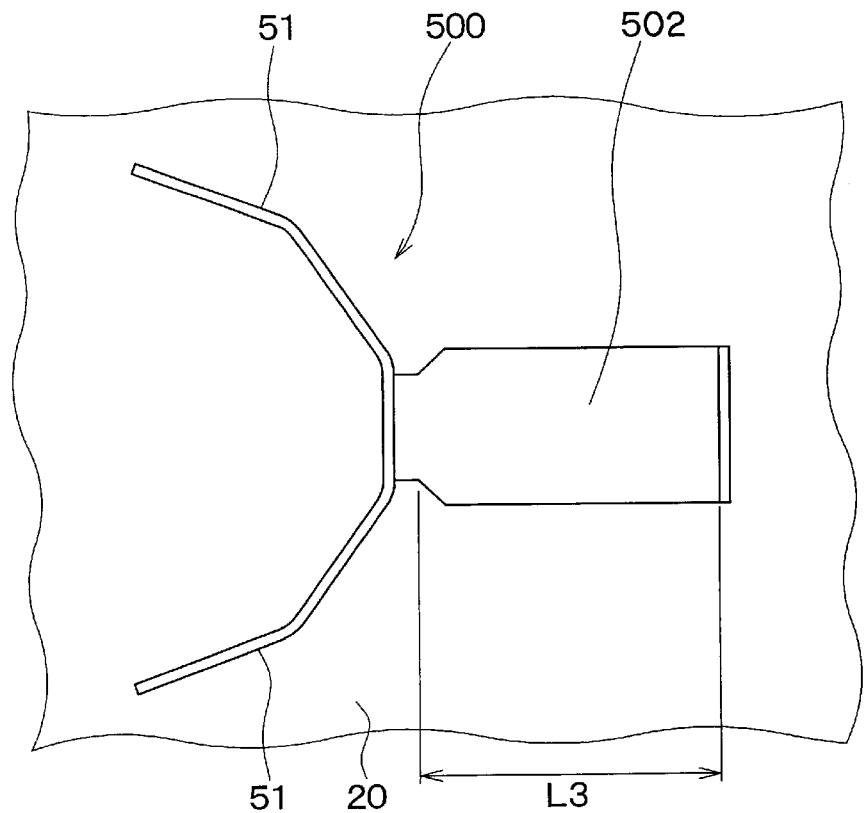
FIG. 8A is a plan view showing a conventional connector mounted on a circuit board.
Figure 8B:
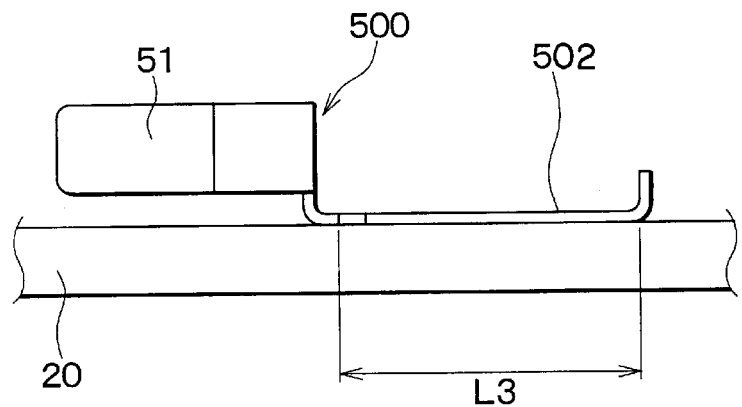
FIG. 8B is a side view showing the conventional connector shown in FIG. 8A.

As shown in FIGS. 4A and 4B, the length L1 of the main stay 52 is shorter than the length L3 of the stay 502 of the conventional connector 500 shown in FIGS. 8A and 8B. The length of the auxiliary stay 54 is L2 as shown in FIGS. 4A and 4B. A total soldering area of the main stay 52 and the auxiliary stay 54 is made substantially equal to the soldering area of the conventional stay 502. In addition, since the stays 52, 54 of the embodiment described above are formed in a rectangular shape, rotation of the connector 50 relative to the circuit board 20 in the re-flow soldering process is prevented. The shape of the stays 52, 54, however, is not limited to the rectangular shape, but it may be formed in other polygonal shapes. Since the connector 50 is supported by two stays 52, 54, its rotation in the re-flow soldering process is further effectively suppressed. Moreover, it is easy to correctly position the connector 50 on the circuit board 20 by the automatic mounting machine, because the sides of the rectangular stays 52, 54 can be easily recognized by an image recognition device in the automatic mounting machine.

Figure 5:
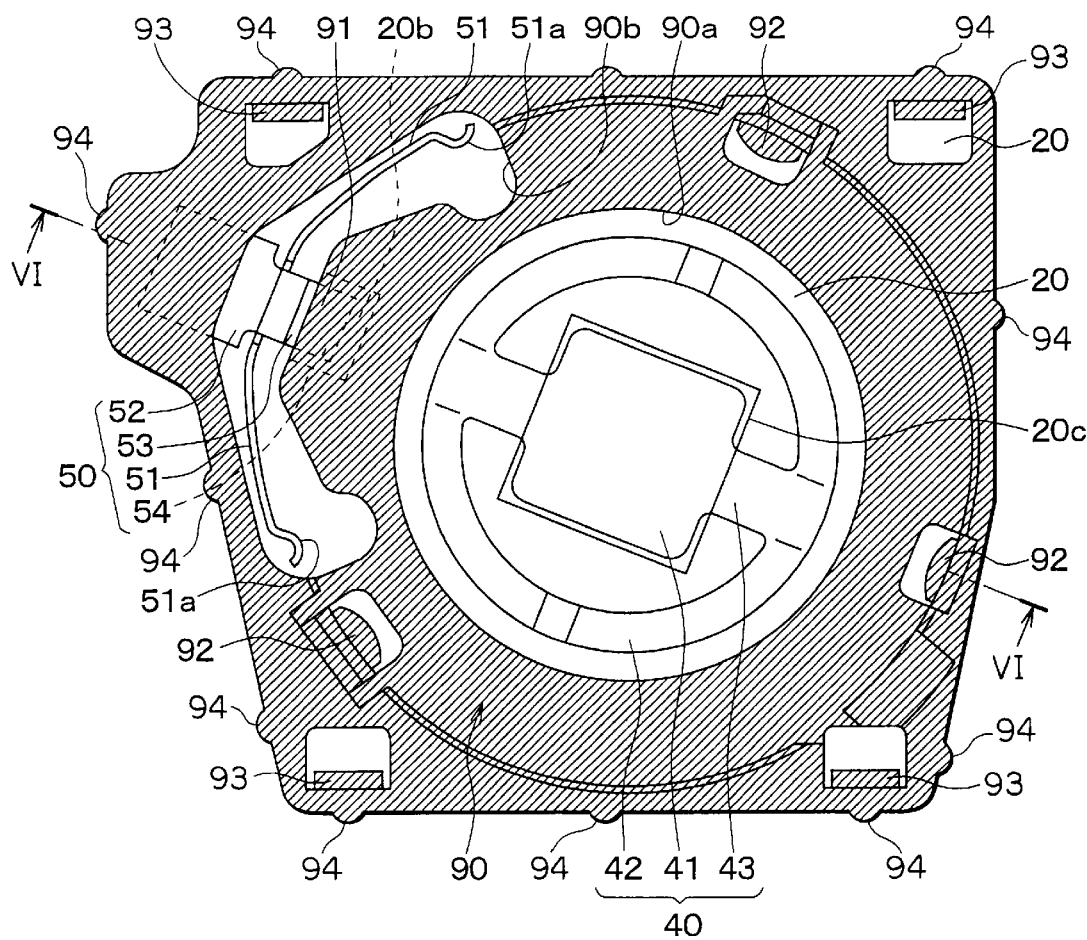
FIG. 5 is a plan view showing a battery holder for holding a button battery and a connector, the battery holder being mounted on a circuit board, as a second embodiment of the present invention.
Figure 6:
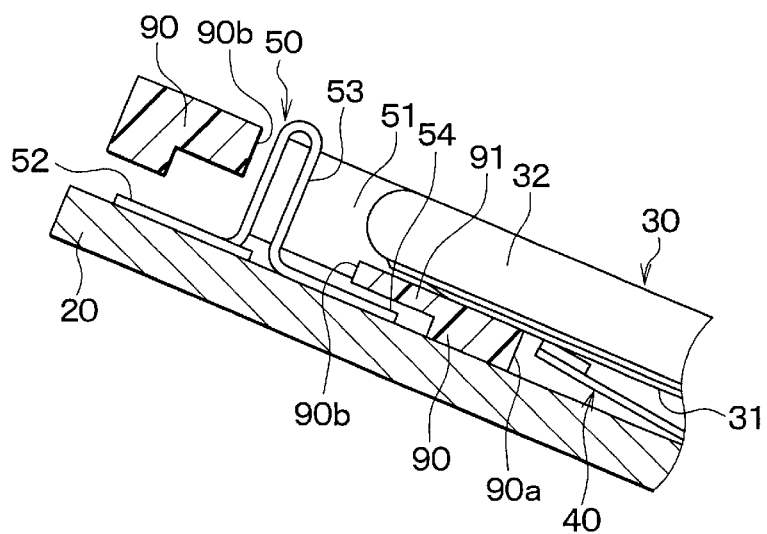
FIG. 6 is a cross-sectional view partially showing the battery holder and the connector shown in FIG. 5.

A second embodiment of the present invention will be described with reference to FIGS. 5 and 6. In this embodiment, a battery holder 90 made of an insulating resin material is additionally contained in the resin cases 10, 11, and other structures are the same as those in the first embodiment. FIG. 5 shows only the connector 40 for the minus terminal, connector 50 for the plus terminal and the battery holder 90. FIG. 6 shows a partial cross-sectional view of those components shown in FIG. 5, taken along line VI—VI in FIG. 5.

A terminal cover 91 is integrally formed with the battery cover 90 and positioned between the auxiliary stay 54 and the minus terminal 31 of the button battery 30. Thus, the auxiliary stay 54 is surely insulated from the minus terminal 31. Hooks 92 for holding the button battery 30 are also integrally formed with the battery holder 90, and the button battery 30 is engaged with the hooks 92 and held in the battery holder 90 as shown in FIG. 6. The battery holder 90 also includes openings 90a, 90b, from which the connectors 40, 50 mounted on the circuit board 20 are exposed toward the button battery 30. The circuit board 20, except portions corresponding to the openings 90a, 90b, is covered with the battery holder 90.

The battery holder 90 is held on the circuit board 20 by hooks 93 that engage with the circuit board 20. The battery holder 90 is also fixed to the resin cases 10, 11 by interposing projections 94 formed at an outer periphery of the battery holder 90 between the resin cases 10 and 11. Since the terminal cover 91 is formed as a part of the battery holder 90, it is not necessary to form the terminal cover 91 as an additional part. The minus terminal 31 of the button battery 30 can be surely insulated from the auxiliary stay 54 by positioning the terminal cover 91 therebetween.

Figure 7A:
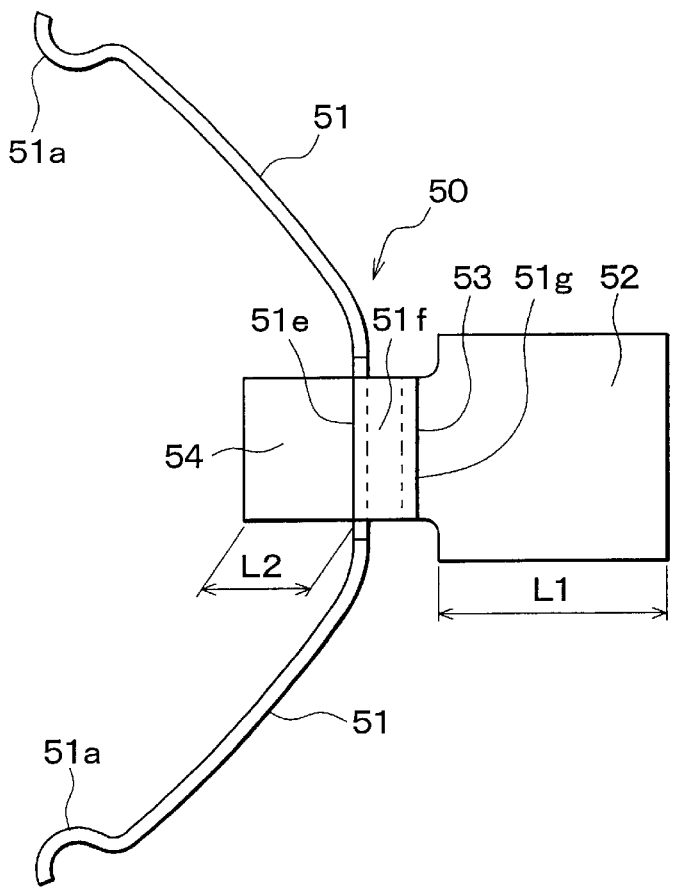
FIG. 7A is a plan view showing a connector, as a third embodiment of the present invention.
Figure 7B:
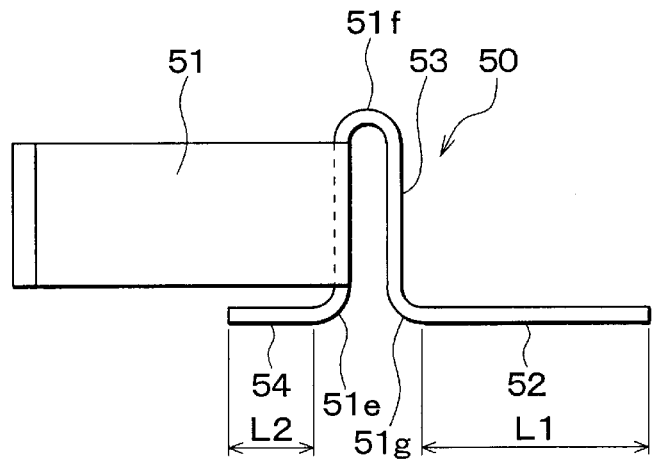
FIG. 7B is a side view showing the connector shown in FIG. 7A.

A third embodiment of the present invention will be described with reference to FIGS. 7A and 7B. In this embodiment, the auxiliary stay 54 is directly connected to the resilient arms 51, while the main stay 52 is connected to the resilient arms 51 via the connecting portion 53. Other structures are the same as those in the first embodiment. In other words, the connecting portion 53 is positioned at the rear side (the side opposite to the battery) of the resilient arms 51. The main stay 52 is bent with a right angle at a bent portion 51g and extends to the rear side of the resilient arms 51. The connecting portion 53 is connected to the resilient arms 51 via a U-shaped portion 51f. The auxiliary stay 54 is bent with a right angle at a bent portion 51e and extends to the front side (the battery side) of the resilient arms 51.

The present invention is not limited to the embodiments described above, but it may be variously modified. For example, though both stays 52, 54 are soldered on the circuit board 20 in the foregoing embodiments, it is possible to solder only the main stay 52 on the circuit board 20. Though the main stay 52 is formed at the rear side of the resilient arms 51 and the auxiliary stay 54 is formed at the front side in the foregoing embodiments, the positions of both stays 52, 54 relative to the resilient arms 51 may be reversed. That is, the main stay 52 may be formed at the front side and the auxiliary stay 54 at the rear side. The number of the resilient arms is not limited to two. The pair of resilient arms 51 may be replaced with a single resilient arm. The polygonal or the rectangular shape of the stays 52, 54 may be changed to a circular shape as long as rotation of the connector 50 in the re-flow soldering process is prevented by some other ways. The arch-shaped surface of the contact 51a may be changed to a round projection. Though the present invention is applied to the transmitter for the keyless entry system in the foregoing embodiments, the present invention may be applied to other electronic devices such as a transmitter for controlling engine operation.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A connector for electrically connecting a plus terminal of a button battery to a circuit board contained in an electronic device, the plus terminal being circularly formed around an outer periphery of the button battery, the connector comprising:

a resilient arm contacting the plus terminal;
a main stay for supporting the resilient arm, the main stay being formed at a rear side of the resilient arm where the button battery is not to be positioned and being soldered on a surface of the circuit board; and an auxiliary stay for supporting the resilient arm, the auxiliary stay being formed at a front side of the resilient arm where the button battery is to be positioned, the auxiliary stay being supported on the surface of the circuit board, wherein:

the resilient arm, the main stay and the auxiliary stay are all integrally made of a conductive metallic plate.

2. The connector as in claim 1, wherein:

the auxiliary stay is also soldered on the surface of the circuit board.

3. The connector as in claim 2, wherein:

the resilient arm contacting the plus terminal of the button battery is composed of a pair of arms symmetrically positioned with respect to the main stay.

4. The connector as in claim 3, wherein:

a contact having a round surface is formed at an end of each of the pair of arms, the end being remotest from the main stay.

5. An electronic device containing a button battery supported on a circuit board, wherein:

the button battery is electrically connected to the circuit board by the connector defined in claim 1.

6. The electronic device as in claim 5, wherein:

the auxiliary stay is soldered on the surface of the circuit board.

7. The electronic device as in claim 5, wherein:

the electronic device is a transmitter for wirelessly sending signals for operating an electric device.

8. The electronic device as in claim 5, wherein:

the button battery is held in a battery holder supported on the circuit board;

the battery holder is made of an insulating material and includes a terminal cover integrally formed with the battery holder; and the terminal cover is positioned between the auxiliary stay and a minus terminal of the button battery to thereby secure insulation between the minus terminal and the auxiliary stay.

* * * * *